United States Patent
Chan et al.

(10) Patent No.: US 6,764,903 B1
(45) Date of Patent: Jul. 20, 2004

(54) DUAL HARD MASK LAYER PATTERNING METHOD

(75) Inventors: Bor-Wen Chan, Hsinchu (TW); Yuan-Hung Chiu, Taipei (TW); Hun-Jan Tao, Hsinchu (TW)

(73) Assignee: Taiwan Semiconductor Manufacturing Co., Ltd, Hsin-Chu (TW)

( * ) Notice: Subject to any disclaimer, the term of this patent is extended or adjusted under 35 U.S.C. 154(b) by 0 days.

(21) Appl. No.: 10/427,451

(22) Filed: Apr. 30, 2003

(51) Int. Cl.[7] .................. H01L 21/336; H01L 21/3205; H01L 21/4763
(52) U.S. Cl. ................... 438/257; 438/301; 438/586
(58) Field of Search ............... 438/257, 301, 438/256, 586, 593, 621, 700

(56) References Cited

U.S. PATENT DOCUMENTS

| | | | |
|---|---|---|---|
| 5,258,095 A | * | 11/1993 | Nagata et al. ............. 438/593 |
| 5,718,800 A | * | 2/1998 | Juengling ................... 438/200 |
| 6,174,818 B1 | | 1/2001 | Tao et al. |
| 6,248,635 B1 | | 6/2001 | Foote et al. |
| 6,429,067 B1 | | 8/2002 | Liu et al. |
| 6,605,541 B1 | * | 8/2003 | Yu ............................ 438/700 |
| 6,607,955 B2 | * | 8/2003 | Lee ............................ 438/256 |

* cited by examiner

*Primary Examiner*—John F. Niebling
*Assistant Examiner*—Walter L. Lindsay, Jr.
(74) *Attorney, Agent, or Firm*—Tung & Associates

(57) ABSTRACT

A method for forming a patterned target layer from a blanket target layer employs a pair of blanket hard mask layers laminated upon the blanket target layer. A patterned third mask layer is formed thereover. The method also employs four separate etch steps. One etch step is an anisotropic etch step for forming a patterned upper lying hard mask layer from the blanket upper lying hard mask layer. The patterned upper lying hard mask layer is then isotropically etched in a second etch step to form an isotropically etched patterned upper lying hard mask layer. The method is particularly useful for forming gate electrodes of diminished linewidths and enhanced dimensional control within semiconductor products.

20 Claims, 1 Drawing Sheet

DUAL HARD MASK LAYER PATTERNING METHOD

BACKGROUND OF THE INVENTION

1. Field of the Invention

The invention relates generally to methods for forming patterned layers within microelectronic products. More particularly, the invention relates to methods for forming uniformly patterned layers within microelectronic products.

2. Description of the Related Art

Semiconductor products commonly employ field effect transistor devices as switching devices within logic products, memory products and embedded logic and memory products.

While field effect transistor devices are common within semiconductor products, they are nonetheless not entirely without problems. As semiconductor product integration levels increase and semiconductor device dimensions decrease, it becomes more difficult to form semiconductor devices with diminished dimensions and enhanced dimensional control. Since a gate electrode with a field effect transistor device defines a channel width and operational characteristics of the field effect transistor device, gate electrode linewidth control within semiconductor products is particularly important.

The present invention is thus directed towards forming patterned layers, such as gate electrodes, of diminished dimensions and enhanced dimensional control.

Various methods have been disclosed for forming patterned layers within microelectronic products.

Included but not limiting are methods disclosed within: (1) Tao et al., in U.S. Pat. No. 6,174,818 (a bilayer hard mask layer method for forming a gate electrode with enhanced dimensional control); (2) Foote et al., in U.S. Pat. No. 6,248,635 (a bilayer hard mask layer method for forming a metal-oxide-nitride-oxide-semiconductor (MONOS) structure with enhanced reliability); and (3) Liu et al., in U.S. Pat. No. 6,429,067 (a bilayer hard-mask layer method for forming gate electrodes of differing linewidths).

The disclosures of the foregoing references are incorporated herein fully by reference.

Desirable are additional methods for forming patterned layers with diminished dimensions and enhanced dimensional control within microelectronic products.

The present invention is directed toward the foregoing object.

SUMMARY OF THE INVENTION

A first object of the invention is to provide a method for forming a patterned layer within a microelectronic product.

A second object of the invention is to provide a method in accord with the first object of the invention, wherein the patterned layer is formed with diminished dimensions and enhanced dimensional control.

In accord with the objects of the invention, the invention provides a method for forming a patterned layer within a microelectronic product.

The method employs a substrate having formed thereover: (1) a blanket target layer, having formed thereupon; (2) a blanket first hard mask layer, having formed thereupon; (3) a blanket second hard mask layer, in turn having formed thereover; (4) a patterned third mask layer. Within the invention, the blanket second hard mask layer is first anisotropically etched within a first etchant to form a patterned second hard mask layer and then isotropically etched within a second etchant to form an isotropically etched patterned second hard mask layer of linewidth less than the patterned second hard mask layer. The isotropically etched patterned second hard mask layer is then used an etch mask with a third etchant for forming a patterned first hard mask layer from the blanket first hard mask layer. The patterned first hard mask layer is then used as an etch mask with a fourth etchant for forming a patterned target layer from the blanket target layer.

The method is particularly useful for forming gate electrodes within field effect transistor devices within semiconductor products.

The invention provides a method for forming a patterned layer with diminished dimensions and enhanced dimensional control.

The invention realizes the foregoing object within the context of a four step etch method that employs a pair of blanket hard mask layers and a patterned third mask layer for forming a patterned target layer from a blanket target layer. Within the four step etch method, an upper lying blanket second hard mask layer is first anisotropically etched to form a patterned hard mask layer and then isotropically etched to form an isotropically etched patterned hard mask layer of linewidth less than the patterned hard mask layer. The isotropically etched patterned hard mask layer may then serve as an etch mask when anisotropically etching layers therebelow.

BRIEF DESCRIPTION OF THE DRAWINGS

The objects, features and advantages of the invention are understood within the context of the Description of the Preferred Embodiment, as set forth below. The Description of the Preferred Embodiment is understood within the context of the accompanying drawings, which form a material part of this disclosure, wherein.

DESCRIPTION OF THE PREFERRED EMBODIMENT

The invention provides a method for forming a patterned layer with diminished dimensions and enhanced dimensional control.

The invention realizes the foregoing object within the context of a four step etch method that employs a pair of blanket hard mask layers having formed thereover a patterned third mask layer. Within the four step etch method, an upper lying of a pair of blanket hard mask layers is first anisotropically etched to form a patterned hard mask layer and then isotropically etched to form an isotropically etched patterned hard mask layer of linewidth less than the patterned hard mask layer. The isotropically etched patterned mask layer may then be employed as an etch mask when anisotropically etching layers therebelow.

FIG. 1 to FIG. 6 show a series of schematic cross-sectional diagrams illustrating the results of progressive stages in forming a patterned layer within a microelectronic product in accord with a preferred embodiment of the invention.

Figure 1:
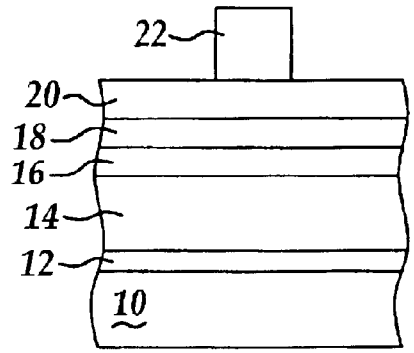
FIG. 1, FIG. 2, FIG. 3, FIG. 4, FIG. 5 and FIG. 6 show a series of schematic cross-sectional diagrams illustrating the results of progressive stages of forming a patterned layer within a microelectronic product in accord with a preferred embodiment of the invention.

FIG. 1 shows a schematic cross-sectional diagram of the microelectronic product at an early stage in its fabrication.

FIG. 1 illustrates a substrate 10. A blanket gate dielectric layer 12 is formed upon the substrate 10. A blanket target layer 14 is formed upon the blanket substrate layer. 12. A blanket first hard mask layer 16 is formed upon the blanket target layer 14. A blanket second hard mask layer 18 is formed. upon the blanket first hard mask layer 16. A blanket anti-reflective coating (ARC) layer 20 is formed upon the blanket second hard mask layer 18. Finally, a patterned third mask layer 22 is formed upon the blanket anti-reflective coating layer 20.

The substrate 10 may be employed within a microelectronic product selected from the group including but not limited to semiconductor products, ceramic substrate products and optoelectronic products. Preferably, the substrate 10 is a semiconductor substrate employed within a semiconductor product.

The blanket substrate layer 12 may be an optional layer within the invention, or it may otherwise be incorporated as a component layer of the substrate 10. More preferably, when the substrate 10 is a semiconductor substrate 10, the blanket substrate layer 12 is a gate dielectric layer employed within a field effect transistor device.

The blanket target layer 14 may be formed of materials including but not limited to conductor materials, semiconductor materials and dielectric materials. The blanket target layer 14 may be formed of thickness as is otherwise generally conventional. When the substrate 10 is a semiconductor substrate and the blanket substrate layer 12 is a gate dielectric layer, the blanket target layer is typically a blanket gate electrode material layer. Typically, the blanket gate electrode material layer is formed at least in part of a doped polysilicon material (having a dopant concentration of from about 1E20 to about 1E22 dopant atoms per cubic centimeter) and formed to a thickness of from about 500 to about 3500 angstroms.

The blanket first hard mask layer 16 and the blanket second hard mask layer 18 may be otherwise generally conventional. However, the invention requires that the blanket first hard mask layer 16 and the blanket second hard mask layer 18 are formed of materials which have differing etch selectivity properties within etch methods which are employed for sequential patterning of the blanket second hard mask layer 18 and the blanket first hard mask layer 16. In general, hard mask materials options may include silicon nitride materials and silicon oxide materials. Particularly desirable in the invention is the use of a blanket second hard mask layer 18 formed of the same material as the blanket target layer 14. Thus, when the substrate 10 is a semiconductor substrate, the blanket substrate layer 12 is a gate dielectric layer and the blanket target layer 14 is a polysilicon gate electrode material layer, the blanket first hard mask layer 16 is preferably formed of a silicon oxide material or silicon nitride material and the blanket second hard mask layer 18 is preferably formed of a polysilicon material. Typically, each of the blanket first hard mask layer 16 and the blanket second hard mask layer 18 is formed to a thickness of from about 50 to about 1000 angstroms.

The blanket anti-reflective coating layer 20 is optional within the invention, but it may be formed of anti-reflective coating materials as are otherwise generally conventional. Typically, the blanket anti-reflective coating layer 20 is formed of an organic polymer anti-reflective coating material, formed to a thickness of from about 300 to about 2000 angstroms.

Finally, the patterned third mask layer 22 is typically a patterned photoresist layer. The invention provides particular value and utility under circumstances where the patterned photoresist layer is formed employing 157 nm photoexposure wavelength actinic radiation. Under such circumstances, a thickness of the patterned third mask layer 22 is generally limited to about 1500 angstroms due to depth of focus considerations.

Figure 2:
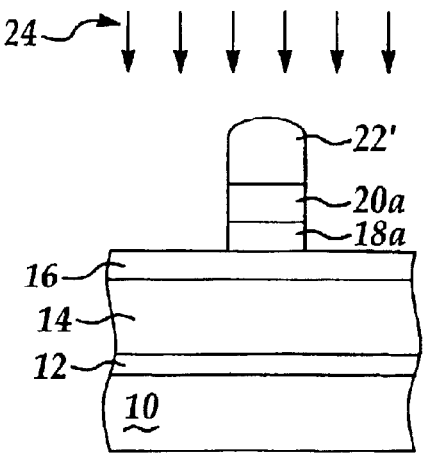

FIG. 2 shows the results of anisotropically etching the blanket anti-reflective coating layer 20 and the blanket second hard mask layer 18 to form a corresponding patterned anti-reflective coating layer 20a and patterned second hard mask layer 18a while employing a first etchant 24 in conjunction with the patterned third mask layer 22 as an etch mask. Incident to the sequential etching, the patterned third mask layer 22 is etched somewhat to form the partially etched patterned third mask layer 22'.

The first etchant 24 is an anisotropic (typically plasma) etchant that employs an etchant gas composition appropriate for the materials from which are formed the blanket anti-reflective coating layer 20 and the blanket second hard mask layer 18. When the blanket anti-reflective coating layer 20 is formed of an organic polymer anti-reflective coating material and the blanket second hard mask layer 18 is formed of a polysilicon material, the first etchant 24 typically employs a chlorine, hydrogen bromide and oxygen containing etchant gas composition. Other chlorine, bromine and oxygen containing etchants may alternatively be employed.

Typically, the first etchant 24 also employs: (1) a reactor chamber pressure of from about 1 to about 100 mtorr; (2) a radio frequency source power of from about 100 to about 1000 watts and a radio frequency bias power of from about 10 to about 500 watts; (3) a substrate 10 (and overlying layers) temperature of from about 0 to about 300 degrees centigrade; (4) a chlorine flow rate of from about 10 to about 300 standard cubic centimeters per minute; (5) a hydrogen bromide flow rate of from about 10 to about 500 standard cubic centimeters per minute; and (6) an oxygen flow rate of about 1 to about 20 standard cubic centimeters per minute.

Figure 3:
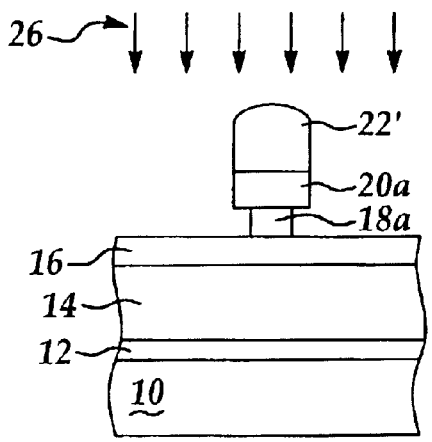

FIG. 3 illustrates the results of isotropically etching the patterned second hard mask layer 18a with a second etchant 26 to form an isotropically etched patterned second mask layer 18a'. Although FIG. 3 illustrates the isotropic etching of the patterned second hard mask layer 18a with the patterned anti-reflective coating layer 20a and the partially etched patterned third mask layer 22' in place, such is preferred although not required within the invention. The isotropically etched patterned second hard mask layer 18a' thus has a linewidth less than the patterned second hard mask layer 18a. Typically, the patterned second hard mask layer 18a has a linewidth of from about 0.06 to about 0.13 microns and the isotropically etched patterned second hard mask layer has a linewidth of from about 0.01 to about 0.09 microns.

The second etchant 26 may be generally analogous to the first etchant 24 as a plasma etchant. Alternatively, the second etchant 26 may be a wet chemical etchant. When provided as a plasma etchant, the second etchant 26 is provided with an increased reactor chamber pressure of from about 1 to about 50 torr, and absent a bias power, such as to provide for an isotropic character of the second etchant 26 with respect to the first etchant 24.

Figure 4:
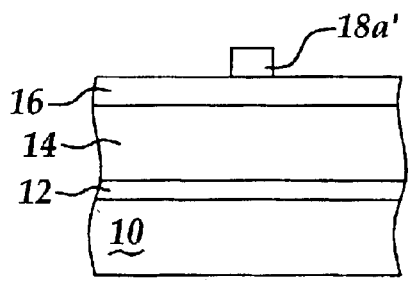

FIG. 4 illustrates the results of stripping the partially etched patterned third mask layer 22' and the patterned anti-reflective coating layer 20a from the isotropically etched patterned second hard mask layer 18a'.

Such stripping may be effected employing wet chemical and dry plasma stripping methods and materials as are conventional in the art.

Figure 5:
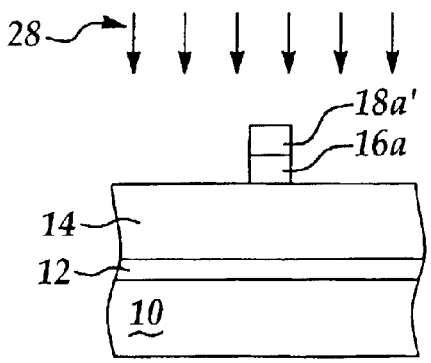

FIG. 5 shows the results of anisotropically etching the blanket first hard mask layer 16 with a third etchant 28 to form a patterned first hard mask layer 16a while employing the isotropically etched patterned second hard mask layer 18a' as an etch mask.

The third etchant 28 is an anisotropic etchant and thus preferably also a plasma etchant. When the isotropically etched patterned second hard mask layer 18a' is formed of a polysilicon material and the blanket first hard mask layer 16 is formed of a silicon nitride material, the third etchant 28 preferably employs an etchant gas composition comprising carbon tetrafluoride, trifluoromethane, difluoromethane and oxygen. Under such circumstances, the third etchant 28 also employs: (1) a reactor chamber pressure of from about 1 to about 100 mtorr; (2) a source radio frequency power of from about100 to about 1000 watts and a bias radio frequency power of from about 10 to about 500 watts; (3) a substrate 10 (and overlying layers) temperature of from about 0 to about 300 degrees centigrade; (4) a carbon tetrafluoride flow rate of from about 10 to about 200 standard cubic centimeters per minute; (2) a trifluoromethane flow rate of from about 10 to about 200 standard cubic centimeters per minute; (6) a difluoromethane flow rate of from about 10 to about 200 standard cubic centimeters per minute; and (4) an oxygen flow rate of from about 1 to about 50 standard cubic centimeters per minute.

Figure 6:
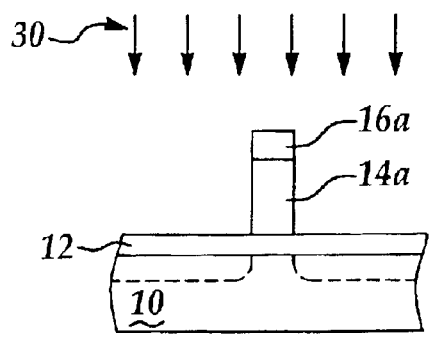

FIG. 6 illustrates the results of etching the blanket target layer 14 with a fourth etchant 30 to form a patterned target layer 14a, while employing the patterned first hard mask layer 16a as an etch mask.

Under circumstances where the blanket second hard mask layer 18 and the blanket target layer 14 are formed of a polysilicon material, the fourth etchant may be provided employing methods and materials analogous, equivalent or identical to those employed in providing the first etchant 24. Under such circumstances, the isotropically etched patterned second hard mask layer 18a' is simultaneously stripped when etching the blanket target layer 14 to form the patterned target layer 14a with the fourth etchant 30.

As is understood by a person skilled in the art, when the substrate 10 is a semiconductor substrate, the blanket substrate layer 12 is a gate dielectric layer and the patterned target layer 14a is a gate electrode, an additional ion implanting into the semiconductor substrate may be provided to form a pair of source/drain regions within the semiconductor substrate 10. The locations of the pair of source/drain regions is shown in phantom. Such additional ion implanting provides a field effect transistor device.

FIG. 1 to FIG. 6 illustrate the results of forming a patterned layer with diminished dimensions (i.e., possibly less than photolithographically resolvable) and enhanced dimensional control within a microelectronic product. The invention realizes the foregoing object by employing a dual hard mask layer method in conjunction with a four step etch method. Within the four step etch method, an upper lying of a pair of blanket hard mask layers is first anisotropically etched and then isotropically etched to form an isotropically etched patterned hard mask layer employed in anisotropically layers therebelow.

The preferred embodiment is illustrative of the invention rather than limiting of the invention. Revisions and modifications may be made to dimensions and structures in accord with the preferred embodiment while still providing a method in accord with the invention, further in accord with the accompanying claims.

What is claimed is:

1. A method for forming a patterned target layer comprising:

providing a substrate;

forming over the substrate a blanket target layer;

forming upon the blanket target layer a blanket first hard mask layer;

forming upon the blanket first hard mask layer a blanket second hard mask layer;

forming over the blanket second hard mask layer a patterned third mask layer;

anisotropically etching the blanket second hard mask layer to form a patterned second hard mask layer while employing a first etchant and the patterned third mask layer as an etch mask;

isotropically etching the patterned second hard mask layer to form an isotropically etched patterned second hard mask layer of linewidth less than the patterned second hard mask layer while employing a second etchant;

anisotropically etching the blanket first hard mask layer to form a patterned first hard mask layer while employing a third etchant and the isotropically etched patterned second hard mask layer as an etch mask; and anisotropically etching the blanket target layer to form a patterned target layer while employing a fourth etchant and the patterned first hard mask layer as an etch mask.

2. The method of claim 1 wherein the substrate is employed within a microelectronic product selected from the group consisting of semiconductor products, ceramic substrate products and optoelectronic products.

3. The method of claim 1 wherein the blanket target layer is formed of a material selected from the group consisting of conductor materials, semiconductor materials and dielectric materials.

4. The method of claim 1 wherein the patterned third mask layer is a patterned photoresist mask layer.

5. The method of claim 1 wherein;

the patterned second hard mask layer has a linewidth of from about 0.06 to about 0.13 microns; and the isotropically etched patterned second hard mask layer . has a linewidth of from about 0.01 to about 0.09 microns.

6. The method of claim 1 wherein the blanket target layer and the blanket second hard mask layer are formed of the same material.

7. The method of claim 6 wherein the fourth etch method also removes the isotropically etched patterned second hard mask layer from the patterned first hard mask layer.

8. A method for forming a gate electrode comprising:

providing a semiconductor substrate;

forming over the semiconductor substrate a blanket gate electrode material layer;

forming upon the blanket gate electrode material layer a blanket first hard mask layer;

forming upon the blanket first hard mask layer a blanket second hard mask layer;

forming over the blanket second hard mask layer a patterned third mask layer;

anisotropically etching the blanket second hard mask layer to form a patterned second hard mask layer while employing a first etchant and the patterned third mask layer as an etch mask;

isotropically etching the patterned second hard mask layer to form an isotropically etched patterned second hard mask layer of linewidth less than the patterned second hard mask layer while employing a second etchant;

anisotropically etching the blanket first hard mask layer to form a patterned first hard mask layer while employing a third etchant and the isotropically etched patterned second hard mask layer as an etch mask; and anisotropically etching the blanket gate electrode material layer to form a gate electrode while employing a fourth etchant and the patterned first hard mask layer as an etch mask.

9. The method of claim 8 wherein the patterned third mask layer is a patterned photoresist mask layer.

10. The method of claim 8 wherein:

the patterned second hard mask layer has a linewidth of from about 0.06 to about 0.13 microns; and the isotropically etched patterned second hard mask layer has a linewidth of from about 0.01 to about 0.09 microns.

11. The method of claim 8 wherein the blanket gate electrode material layer and the blanket second hard mask layer are formed of the same material.

12. The method of claim 11 wherein the fourth etchant also removes the isotropically etched patterned second hard mask layer from the patterned first hard mask layer.

13. A method for forming a gate electrode comprising:

providing a semiconductor substrate;

forming over the semiconductor substrate a blanket gate electrode material layer formed of a polysilicon material;

forming upon the blanket gate electrode material layer a blanket first hard mask layer;

forming upon the blanket first hard mask layer a blanket second hard mask layer formed of the polysilicon material;

forming over the blanket second hard mask layer a patterned third mask layer;

anisotropically etching the blanket second hard mask layer to form a patterned second hard mask layer while employing a first etchant and the patterned third mask layer as an etch mask;

isotropically etching the patterned second hard mask layer to form an isotropically etched patterned second hard mask layer of linewidth less than the patterned second hard mask layer while employing a second etchant;

anisotropically etching the blanket first hard mask layer to form a patterned first hard mask layer while employing a third etchant and the isotropically etched patterned second hard mask layer as an etch mask; and anisotropically etching the blanket gate electrode material layer to form a gate electrode while employing a fourth etchant and the patterned first hard mask layer as an etch mask.

14. The method of claim 13 wherein the patterned third mask layer is a patterned photoresist mask layer.

15. The method of claim 13 wherein:

the patterned second hard mask layer has a linewidth of from about 0.06 to about 0.13 microns; and the isotropically etched patterned second hard mask layer has a linewidth of from about 0.01 to about 0.09 microns.

16. The method of claim 13 wherein the fourth etchant also removes the isotropically etched patterned second hard mask layer from the patterned first hard mask layer.

17. The method of claim 13 wherein the first etchant is a plasma etchant employing a chlorine and oxygen etchant gas composition.

18. The method of claim 17 wherein the second etchant is a plasma etchant employing the chlorine and oxygen etchant gas composition, but at a higher reactor chamber pressure than the first etchant.

19. The method of claim 18 wherein the third etchant is a plasma etchant employing a carbon tetrafluoride, trifluoromethane, difluoromethane and oxygen etchant gas composition.

20. The method of claim 19 wherein the fourth etchant is a plasma, etchant employing the chlorine and oxygen etchant gas composition.

* * * * *